(12) United States Patent
Maruyama

(10) Patent No.: US 6,849,917 B2
(45) Date of Patent: Feb. 1, 2005

(54) PHOTOVOLTAIC ELEMENT

(75) Inventor: Eiji Maruyama, Katano (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/388,449

(22) Filed: Mar. 17, 2003

(65) Prior Publication Data
US 2003/0178630 A1 Sep. 25, 2003

(30) Foreign Application Priority Data
Mar. 19, 2002 (JP) .......................... 2002-076977

(51) Int. Cl.⁷ ...................... H01L 31/00; H01L 31/075; H01L 31/06
(52) U.S. Cl. ...................... 257/448; 257/458; 257/459; 257/464
(58) Field of Search ................................. 257/439, 448, 257/458, 459, 464

(56) References Cited

U.S. PATENT DOCUMENTS 5,057,244 A * 10/1991 Nitta et al. ............... 252/501.1
5,626,688 A * 5/1997 Probst et al. ............... 136/265
2001/0029978 A1 * 10/2001 Nakai et al. ................ 136/258

* cited by examiner

Primary Examiner—Ngân V. Ngô
(74) Attorney, Agent, or Firm—Armstrong, Kratz, Quintos, Hanson & Brooks, LLP

(57) ABSTRACT

In a photovoltaic element obtained by forming an ITO film, that is a transparent conductive film, on a semiconductor layer composed of an n-type silicon wafer, an i-type amorphous silicon hydride layer and a p-type amorphous silicon hydride layer, the ITO film has an interface layer as an alkali diffusion prevention region on a side adjacent to the semiconductor layer, and a bulk layer layered on the interface layer. The crystallinity of the interface layer is made lower than that of the bulk layer by changing the water partial pressure when forming the interface layer and the bulk layer.

16 Claims, 8 Drawing Sheets

PHOTOVOLTAIC ELEMENT

BACKGROUND OF THE INVENTION

The present invention relates to a photovoltaic element for use in a solar cell, an optical sensor, etc. having a structure comprising a transparent conductive film deposited on a semiconductor layer, like a pin junction, and also relates to a method for manufacturing the photovoltaic element.

In recent years, the introduction of a photovoltaic power generation system that is installed on the roof of a house has been promoted rapidly. A solar cell for use in the photovoltaic power generation system utilizes, for example, a photovoltaic element which is manufactured by depositing i-type and p-type amorphous or microcrystalline semiconductor layers and a transparent conductive film made of a material such as an indium tin oxide (ITO) and zinc oxide (ZnO) successively on an n-type crystalline silicon wafer and then forming a collecting electrode on the transparent conductive film.

Since a solar cell using such a photovoltaic element is generally mounted outdoors, it needs to have high environment resistance reliability. Hence, conventionally, when a photovoltaic element is incorporated as a product into a module, a cover glass is often used for the purpose of protecting the photovoltaic element, and thereby ensuring environmental resistance of the module.

However, since, in general, inexpensive white plate glass is used as the cover glass, alkaline ions such as Na, Li and K contained in the white plate glass are sometimes diffused into the amorphous or microcrystalline semiconductor layers through the transparent conductive film under conditions such as a high humidity condition and exert a vicious influence. For example, when alkaline ions are diffused into the amorphous or microcrystalline semiconductor layers, this diffusion causes a diffusion potential change and may cause the problem of deterioration in the characteristics of the photovoltaic element.

It is therefore desirable that the photovoltaic element itself should have excellent environment resistance, particularly, good resistance to alkaline ions, and there has been a demand for an improved transparent conductive film. Moreover, in order to achieve high efficiency, the transparent conductive film of the photovoltaic element is required to have high light transmittance and low electrical resistance. In general, in order to realize high light transmittance and low electrical resistance, it is necessary to improve the crystallinity of the transparent conductive film. However, when ITO and ZnO which are polycrystalline substances are used, the crystal grains become larger, and accordingly the influence of the crystal grain boundaries increases. Thus, there are possibilities of promotion of diffusion of alkaline ions through the grain boundaries as a path and a decrease in the environment resistance reliability.

BRIEF SUMMARY OF THE INVENTION

The present invention has been made with the aim of solving the above problems, and it is an object of the present invention to provide a photovoltaic element capable of increasing the environment resistance reliability without decreasing the efficiency of the photovoltaic element and also to provide a method for manufacturing the photovoltaic element.

A photovoltaic element of the present invention comprises an alkali diffusion prevention region within a transparent conductive film. Hence, diffusion of alkaline ions into a semiconductor layer through the transparent conductive film is prevented by this alkali diffusion prevention region, and the environmental resistance reliability increases.

This alkali diffusion prevention region is provided on a side adjacent to the semiconductor layer, and the crystallinity in this region is lower than that in other region of the transparent conductive film. In the alkali diffusion prevention region with low crystallinity, the influence of the crystal grain boundaries is smaller, and the diffusion of alkaline ions through the boundaries as a path is reduced. In the other region with high crystallinity, since it is possible to realize high light transmittance and low electrical resistance, the efficiency of the photovoltaic element does not decrease. It is thus possible to achieve both high efficiency and high environmental resistance reliability required for the photovoltaic element.

The alkali diffusion prevention region is in an amorphous state, for example. As the alkali diffusion prevention region, it is possible to use a film containing, for example, silicon oxide, silicon nitride or a mixture thereof, or a transparent metal film with a thickness ranging from several Å to 100 Å.

In the case where the alkali diffusion prevention region and the other region are made of the same material (for example, ITO) of different crystallinity, they can be fabricated easily. In this case, a preferred crystallization ratio in the alkali diffusion prevention region is 0% to 90%, and more particularly 0% to 10%. Thus, in the alkali diffusion prevention region, the influence of the crystal grain boundaries is smaller, and the diffusion of alkaline ions through the boundaries as a path is reduced. Besides, the thickness of the alkali diffusion prevention region is preferably not more than 20 Å. Hence, in the alkali diffusion prevention region, the influence of the crystal grain boundaries is smaller, and the diffusion of alkaline ions through the boundaries as a path is reduced. In the other region, since high light transmittance and low electrical resistance can be realized, it is possible to prevent a decrease in the energy conversion efficiency of the photovoltaic element.

As the semiconductor layer, any one of a-Si:H, a-SiC:H, a-SiGe:H, $\mu$c-Si:H, $\mu$c-SiC:H, and $\mu$c-SiGe:H is used. It is therefore possible to limit deposition of crystals in the interface region of the transparent conductive film with the semiconductor layer, and easily form the transparent conductive film in an amorphous state.

In a method for manufacturing a photovoltaic element of the present invention, when layering a transparent conductive film, a first layer is formed at a first water partial pressure and a second layer is formed at a second water partial pressure. At this time, by setting the first water partial pressure to be higher than the second water partial pressure, the crystallization ratio of the first layer that is a layer on a side adjacent to the semiconductor layer can be made lower, and therefore it is possible to increase the alkaline ion resistance in the first layer.

Moreover, by setting the first water partial pressure not to be lower than $5 \times 10^{-4}$ Pa but not to be higher than $5 \times 10^{-3}$ Pa, it is possible to increase the alkaline ion resistance without decreasing the energy conversion efficiency in the first layer. Furthermore, a heat treatment is performed after forming the first layer. It is thus possible to crystallize a part while holding the amorphous state in the first layer, and increase the energy conversion efficiency without decreasing the alkaline ion resistance.

The above and further objects and features of the invention will more fully be apparent from the following detailed description with accompanying drawings.

DETAILED DESCRIPTION OF THE INVENTION

The following description will explain the present invention in detail, based on the drawings illustrating some embodiments thereof.

Figure 1:
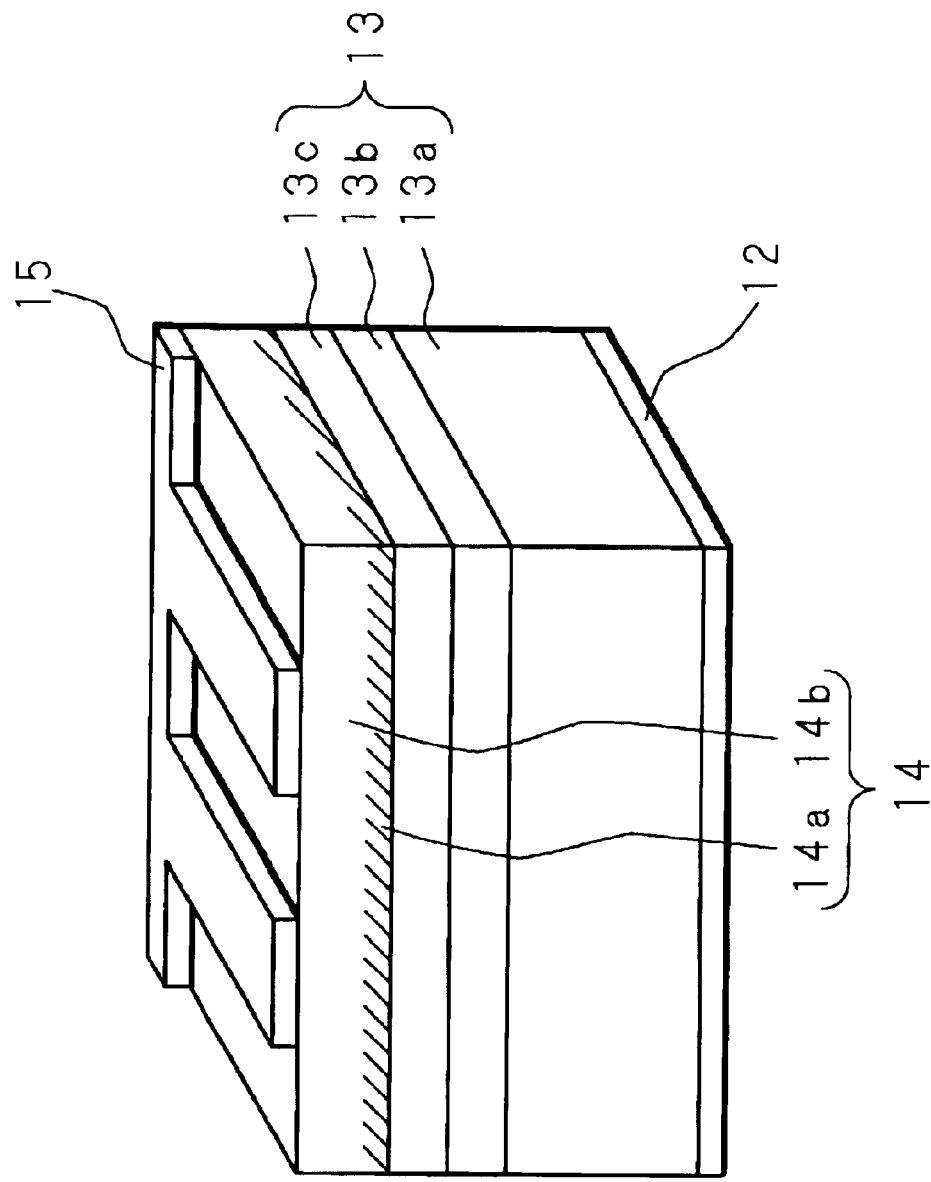
FIG. 1 is a perspective view showing one example of photovoltaic element of the present invention.
Figure 2:
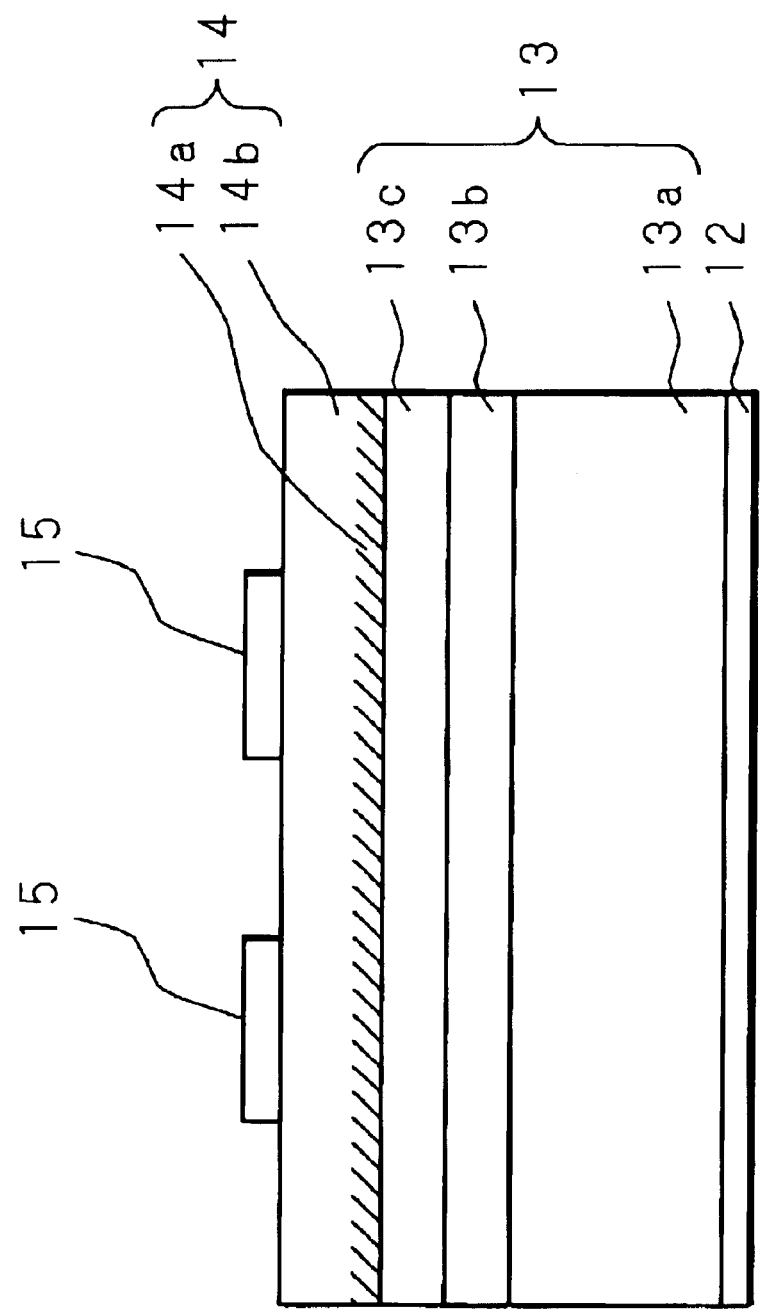
FIG. 2 is a schematic cross sectional view showing one example of photovoltaic element of the present invention.

FIG. 1 and FIG. 2 are the perspective view and schematic cross sectional view showing one example of photovoltaic element of the present invention. In these figures, 13 is a semiconductor layer comprising a pin junction. The semiconductor layer 13 is constructed by forming an i-type amorphous silicon hydride layer 13 and a p-type amorphous silicon hydride layer 13c on the front surface of an n-type silicon wafer (thickness: 300 μm) 13a.

A Sn-doped indium tin oxide film 14 (hereinafter referred to as the "ITO film 14"), that is a transparent conductive film, is deposited on the front surface of this semiconductor layer 13 (p-type amorphous silicon hydride layer 13c). By controlling the water partial pressure when forming the ITO film 14 as described later, it is possible to control the crystallinity of an interface layer 14a in the vicinity of the boundary with the semiconductor layer 13 and in a bulk layer 14b on the interface layer 14a. This interface layer 14a functions as an alkali diffusion prevention region for preventing alkali diffusion. In the present invention, the interface layer 14a has a low crystallinity, while the other bulk layer 14b has a high crystallinity.

Formed on the ITO film 14 is a comb-like collecting electrode 15 made of a silver paste obtained by kneading a silver fine powder into an epoxy resin. Furthermore, on the back surface of the semiconductor layer 13 (silicon wafer 13a), a back electrode 12 is formed by vapor-depositing a metal film such as Ag and Al.

A photovoltaic device such as a solar cell and an optical sensor incorporates a photovoltaic element including the above-mentioned back electrode 12, semiconductor layer 13, ITO film 14 and collecting electrode 15 as a module, and comprises a transparent resin film (not shown) on the ITO film 14 and collecting electrode 15 and further a cover glass (not shown) containing alkaline ions such as Na, Li and K on the resin film so as to protect the photovoltaic element over a long period of time.

The following description will explain a method for manufacturing the photovoltaic element shown in FIG. 1 and FIG. 2.

After removing impurities from the n-type (100) silicon wafer 13a with a relative resistance of about 1 Ω·cm and a thickness of 300 μm by normal washing, the i-type amorphous silicon hydride layer 13b and the p-type amorphous silicon hydride layer 13c are deposited in about 5 nm each by a known RF plasma CVD technique so as to form a pin junction. The formation temperature when depositing the i-type amorphous silicon hydride layer 13b and the p-type amorphous silicon hydride layer 13c is 100° C. to 300° C., the reaction pressure is 5 Pa to 100 Pa, and the RF power is 1 mW/cm$^2$ to 500 mW/cm$^2$.

As a p-type dopant used when forming the p-type amorphous silicon hydride layer 13c, any one of B, Al, Ga and In, which are group 13 elements, is used. By mixing a compound gas containing at least one of these elements into a source gas such as SiH$_4$, it is possible to control the layer to p-type. Besides, in order to obtain the n-type silicon wafer 13a, a compound gas containing at least one of P, N, As and Sb, which are group 15 elements, is used.

Each of the i-type amorphous silicon hydride layer 13b and the p-type amorphous silicon hydride layer 13c can be formed by using known techniques such as a vapor deposition technique, a sputtering technique, a microwave plasma CVD technique, an ECR technique, a thermal CVD technique, and an LPCVD technique, instead of the RF plasma CVD technique. The semiconductor that forms the semiconductor layer 13 may be a crystalline semiconductor, an amorphous semiconductor containing at least one of hydrogen and fluorine, or microcrystalline of any one of Si, SiGe, SiGeC, SiC, SiN, SiGeN, SiSn, SiSnN, SiSnO, SiO, Ge, GeC and GeN.

Next, the ITO film 14 as a transparent conductive film is formed on the front surface of the p-type amorphous silicon hydride layer 13c. It was found as a result of research by the present inventor et al. that the ITO film 14 having the characteristics of the present invention is obtainable by the following technique.

A sintered body of an In$_2$O$_3$ powder mixed with 5 wt % of SnO$_2$ powder is mounted as a target on the cathode. Although the amount of Sn contained in the ITO film 14 can be changed by changing the amount of SnO$_2$ to be mixed, the amount of Sn, based on In, is preferably 1 at % to 10 at %, and more preferably 3 at % to 7 at %. The sintered density of the target is preferably 90% or more. Note that, instead of SnO$_2$, it is possible to use at least one of Zn, As, Ca, Cu, F, Ge, Mg, S, Si and Te as the dopant.

Then, after placing a sample to be parallel to and face the cathode, a chamber is evacuated. The temperature of the sample is kept at 25° C. to 150° C. using a heater, the pressure is kept at 0.4 Pa to 1.3 Pa by a flow of a mixed gas of Ar and O$_2$, and 1 kW DC power is supplied to the cathode so as to start discharging. The film deposition rate when the sample is stationary against the cathode is about 67 nm/min. Instead of Ar, it is possible to use an inert gas such as He, Ne, Kr and Xe, or a mixed gas thereof. It is also possible to perform gas discharge by pulse modulation DC discharge, RF, VHF, or microwave discharge.

Next, the comb-like collecting electrode 15 is formed on the ITO film 14. After forming the collecting electrode 15 in a height of 10 μm to 30 μm and a width of 100 μm to 500 μm by screen printing using a silver paste obtained by kneading a silver fine powder into an epoxy resin, it is sintered and hardened for 80 minutes at 200° C. so as to form a shape having a plurality of mutually parallel branch parts. Then, the back electrode 12 is formed by vapor-depositing a metal film such as Ag and Al on the back surface of the semiconductor layer 13.

The following description will explain the results of the characteristic evaluation tests performed by the present inventor et al. on the ITO film 14. The characteristic evaluation tests were performed so as to evaluate the energy conversion efficiency and the resistance to sodium ions (alkali resistance). Here, the evaluation of the resistance to sodium ions was performed by applying 0.1 g of $NaHCO_3$ aqueous solution to the ITO film 14, leaving it for 3 hours at 200° C., and then measuring the output of the photovoltaic element ($P_{max}$ after Na test).

Figure 3:
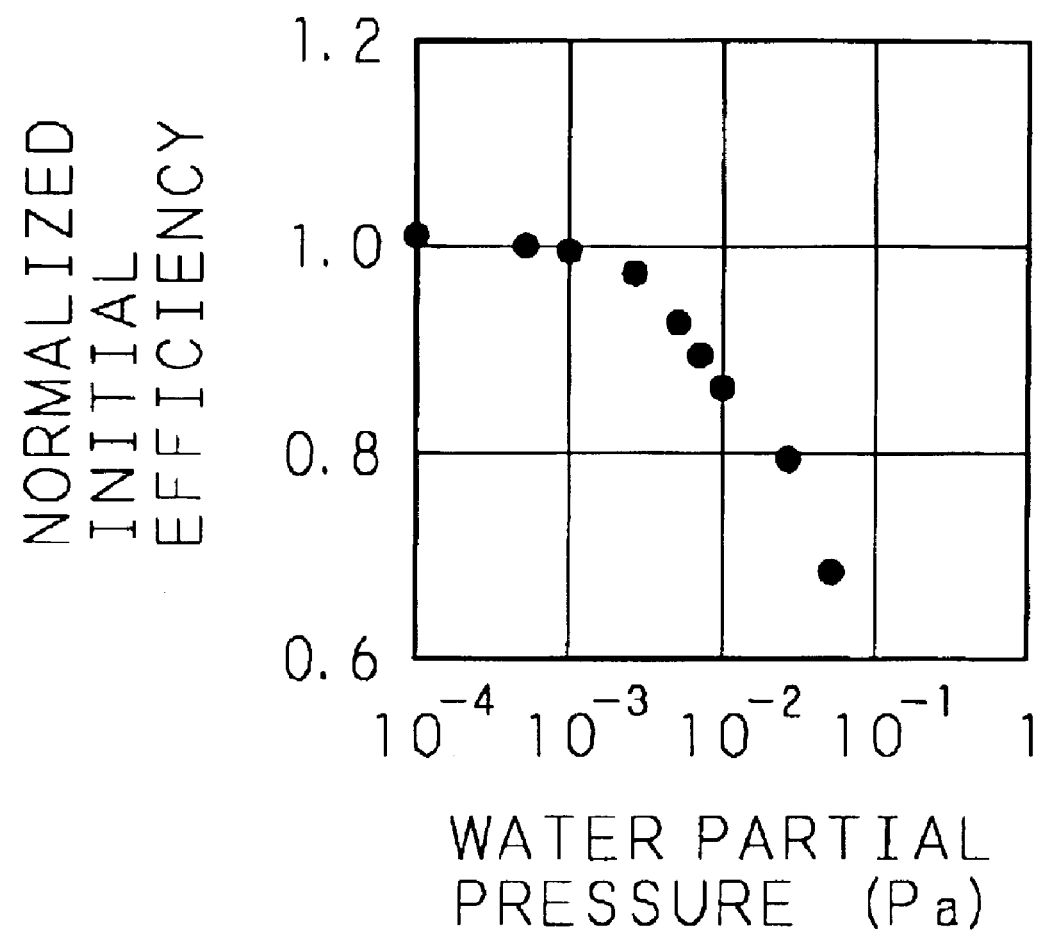
FIG. 3 is a graph showing the relationship between the water partial pressure in forming an interface layer and the normalized initial efficiency.

FIG. 3 is a graph showing the relationship between the water partial pressure in forming the interface layer 14a and the normalized initial efficiency. The axis of abscissas indicates the water partial pressure in forming the interface layer 14a, while the axis of ordinates indicates the value of output of the photovoltaic element when the interface layer 14a was formed by changing the water partial pressure. Note that the axis of ordinates is normalized by the value of output of the photovoltaic element when an ITO single-layer film was formed as the transparent conductive film at a water partial pressure of $1 \times 10^{-3}$ Pa.

Prior to the evaluation of the characteristics of the interface layer 14a, first, with the use an ITO target doped with 5 at % $SnO_2$, the interface layer 14a was deposited in a thickness of 20 Å on the surface of the semiconductor layer 13 at a water partial pressure of $5 \times 10^{-2}$ Pa to $1 \times 10^{-4}$ Pa, a pressure of 0.5 Pa, a DC power of 1 kW and a substrate temperature of 200° C. under the conditions that the Ar flow rate was 200 sccm and the oxygen flow rate was 12 sccm, and then the bulk layer 14b was deposited in a thickness of 980 Å on the interface layer 14a at a water partial pressure of $1 \times 10^{-4}$ Pa, thereby forming the photovoltaic element. Besides, the photovoltaic element which was used to normalize the output is an ITO single-layer film (with a thickness of 1000 Å) formed at a constant water partial pressure ($1 \times 10^{-3}$ Pa).

As shown in FIG. 3, when the water partial pressure in forming the interface layer 14a was $1 \times 10^{-3}$ Pa or less, the output was equal to or more than that obtained when the ITO single-layer film was formed. However, it was confirmed that, when the water partial pressure in forming the interface layer 14a was $2.5 \times 10^{-3}$ Pa or more, the output decreased due to a decrease in the curve factor and open-circuit voltage.

Figure 4:
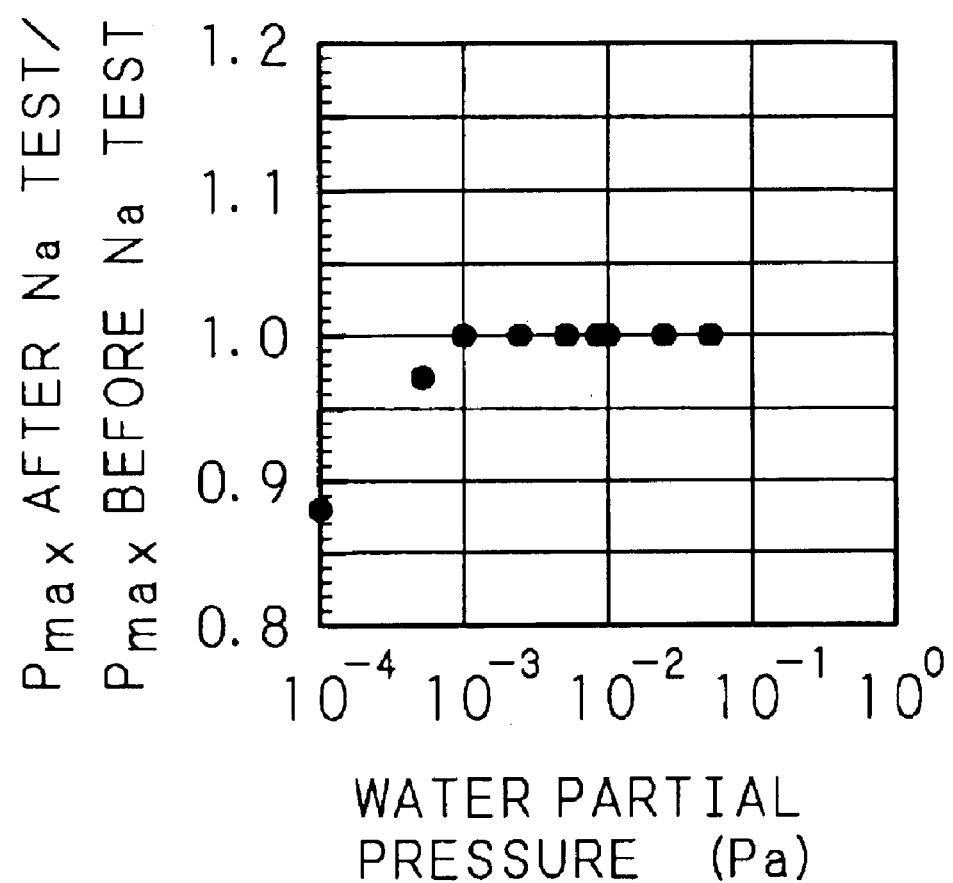
FIG. 4 is a graph showing the relationship between the water partial pressure in forming the interface layer and the alkali resistance.

FIG. 4 is a graph showing the relationship between the water partial pressure in forming the interface layer 14a and the alkali resistance. The axis of abscissas indicates the water partial pressure in forming the interface layer 14a, while the axis of ordinates indicates the value obtaining by normalizing $P_{max}$ after Na test by the initial output before applying the $NaHCO_3$ aqueous solution ($P_{max}$ before Na test).

As shown in FIG. 4, when the water partial pressure in forming the interface layer 14a was $1 \times 10^{-3}$ Pa or more, a decrease in the output was not seen in the alkali resistance test. However, it was found that the alkali resistance decreased at a water partial pressure lower than $1 \times 10^{-3}$ Pa. Moreover, the crystallinity was evaluated by X-ray diffraction. In the case of the interface layer 14a formed at a water partial pressure of $1 \times 10^{-3}$ Pa or more, even when a heat treatment was applied in forming the collecting electrode 15, a random diffraction distribution representing amorphous was observed in the interface layer 14a. In addition, it was confirmed that the amorphous component increased with an increase in the water partial pressure in forming the interface layer 14a.

The above results indicate that, when the interface layer 14a of the ITO film 14 was formed on the front surface of the p-type amorphous silicon hydride layer 13c at a high water partial pressure of not lower than $10 \times 10^{-3}$ Pa, the interface layer 14a containing the amorphous component was formed, and a part of the amorphous component remained, although the crystallinity was improved by the heat treatment performed thereafter in forming the collecting electrode 15. It was also confirmed by observation using a transmission electron microscope that a particularly large amount of amorphous component was present in a region of the interface layer 14a closest to the p-type amorphous silicon hydride layer 13c.

It was also found from FIG. 3 and FIG. 4 that, in order to achieve both improved initial output and alkali resistance, there is an optimum condition for the water partial pressure in forming the interface region with a thickness of not more than 20 Å of the ITO film 14 on a side adjacent to the semiconductor layer 13, and, in this embodiment, the water partial pressure is $1 \times 10^{-3}$ Pa.

Figure 5:
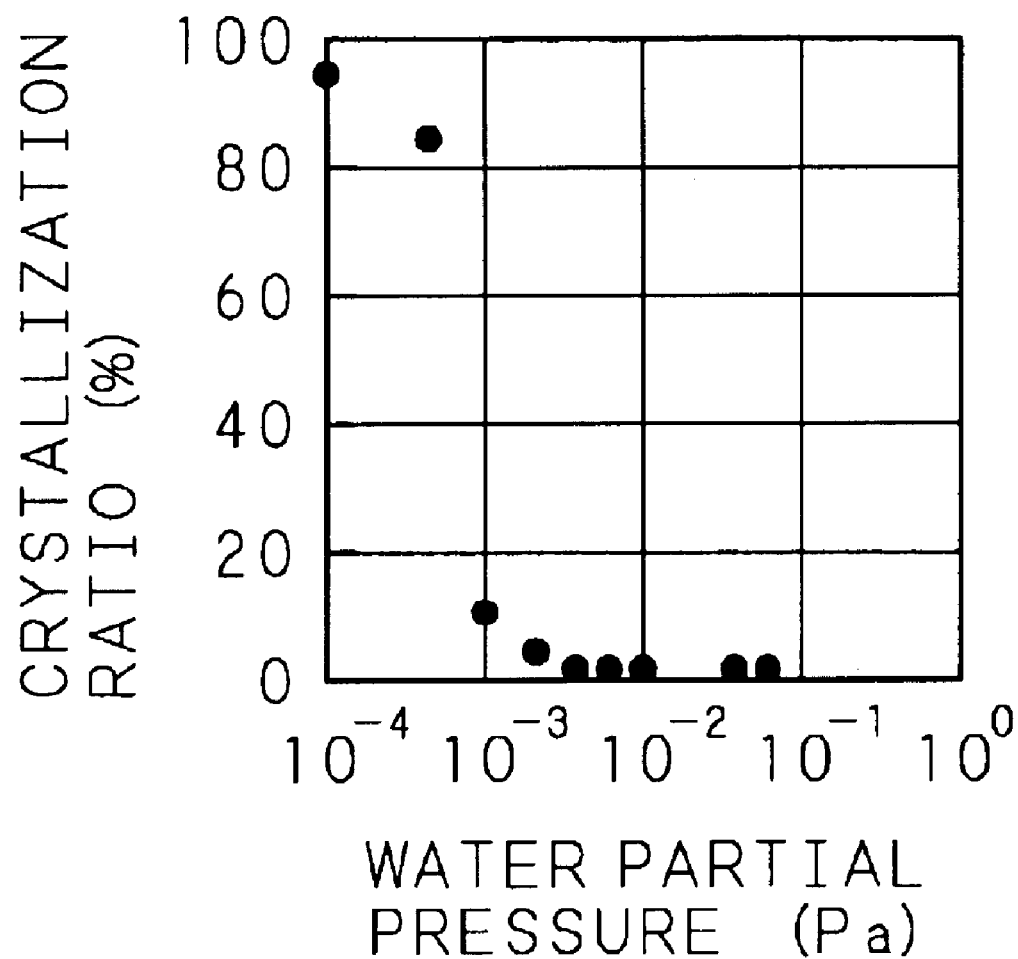
FIG. 5 is a graph showing the relationship between the water partial pressure in forming the interface layer and the crystallization ratio.

FIG. 5 is a graph showing the relationship between the water partial pressure in forming the interface layer 14a and the crystallization ratio. In FIG. 5, the axis of abscissas indicates the water partial pressure in forming the interface layer 14a, while the axis of ordinates indicates the crystallization ratio. Here, the crystallization ratio is defined by (the area where a crystal lattice image can be confirmed)/(the total area) observed by a transmission electron microscope.

As shown in FIG. 5, the higher the water partial pressure in forming the interface layer 14a, the lower the crystallization ratio. In other words, in view of FIG. 5 together with FIG. 4, it was confirmed that the alkali resistance can be improved significantly with a crystallization ratio of not higher than 10%.

Note that the bulk layer 14b of every sample evaluated in FIG. 4 has a crystallization ratio of not less than 98%, which is higher than the crystallization ratio of the interface layer 14a. The reason for this is that, since the photovoltaic element is required to provide a high output, the ITO film 14 needs to achieve both low resistance and high transmittance, and therefore a high crystallization ratio is essential.

Here, Table 1 shows the relationship between the crystallization ratio of the ITO single-layer film and the normalized output of the photovoltaic element in the ITO single-layer structure.

TABLE 1

| Crystallization ratio (%) | 100 | 95 | 88 | 2 |
|---|---|---|---|---|
| Normalized output | 1.00 | 0.98 | 0.72 | 0.64 |

A normalized output is an output normalized by an output obtained when the crystallization ratio is 100%. As shown in Table 1, when the crystallization ratio is 95% or more, it is possible to keep high level normalized outputs, but, when the crystallization ratio is lower than 95%, the output of the photovoltaic element decreases largely due to an increase in resistance and an increase in absorption loss.

Figure 6:
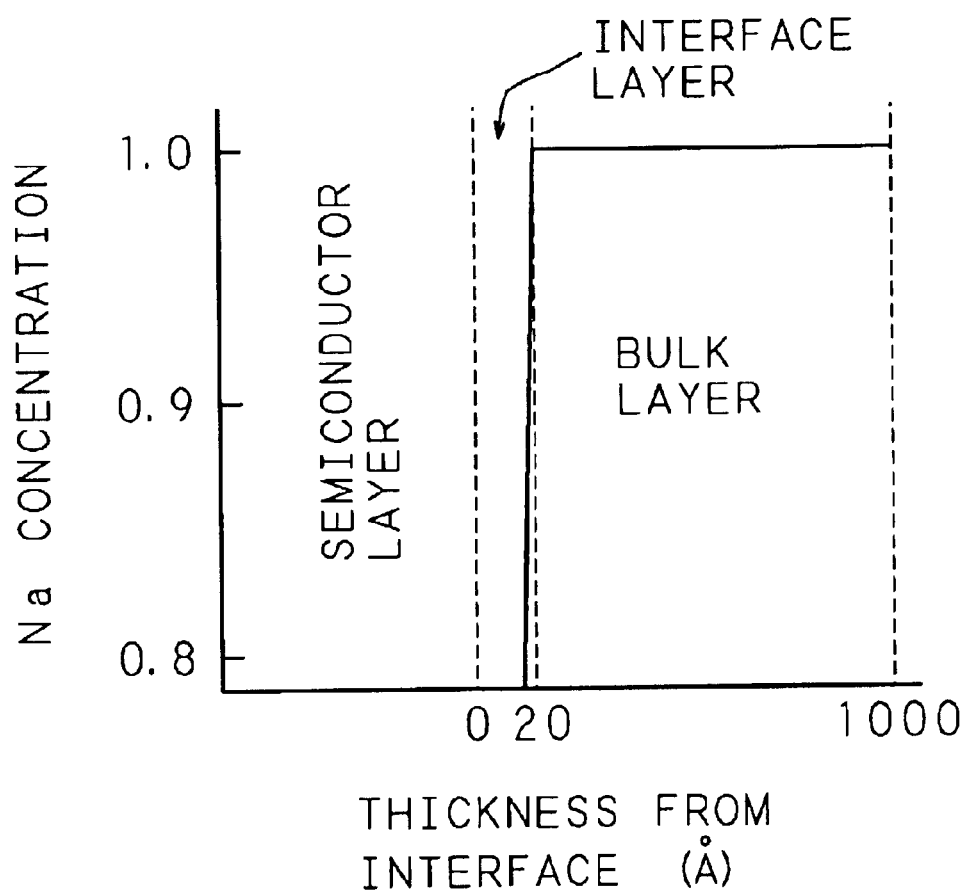
FIG. 6 is a graph showing the Na concentration in the photovoltaic element.

FIG. 6 is a graph showing the Na concentration in the photovoltaic element. The axis of abscissas indicates the Na concentration, while the axis of ordinates indicates the thickness from the interface between the semiconductor layer 13 and the ITO film 14. As shown in FIG. 6, the Na concentration in the bulk layer 14b of the ITO film 14 is almost constant, but the Na concentration decreases abruptly in the interface layer 14a which was treated by adjusting the water partial pressure appropriately, and it was confirmed that alkaline ions are effectively blocked by the interface layer 14a of the ITO film 14.

As described above, the photovoltaic element of the present invention is characterized in that, in the transparent conductive film (ITO film 14), the interface region with a thickness of not more than 20 Å on a side of the transparent conductive film adjacent to the semiconductor layer 13, which is a light incident side, has a relatively lower crystallinity than the bulk region formed on the interface region and includes an amorphous structure. Moreover, with the use of such a photovoltaic element, it is possible to realize a photovoltaic device, such as a solar cell and an optical sensor, which has both improved photoelectric conversion characteristic and alkali resistance.

Note that although the above-described embodiment illustrates an example in which the transparent conductive film is made of a single material (ITO), in other words, the alkali diffusion prevention region and other region are made of the same material (ITO), it is possible to make these two regions by using different materials.

Figure 7:
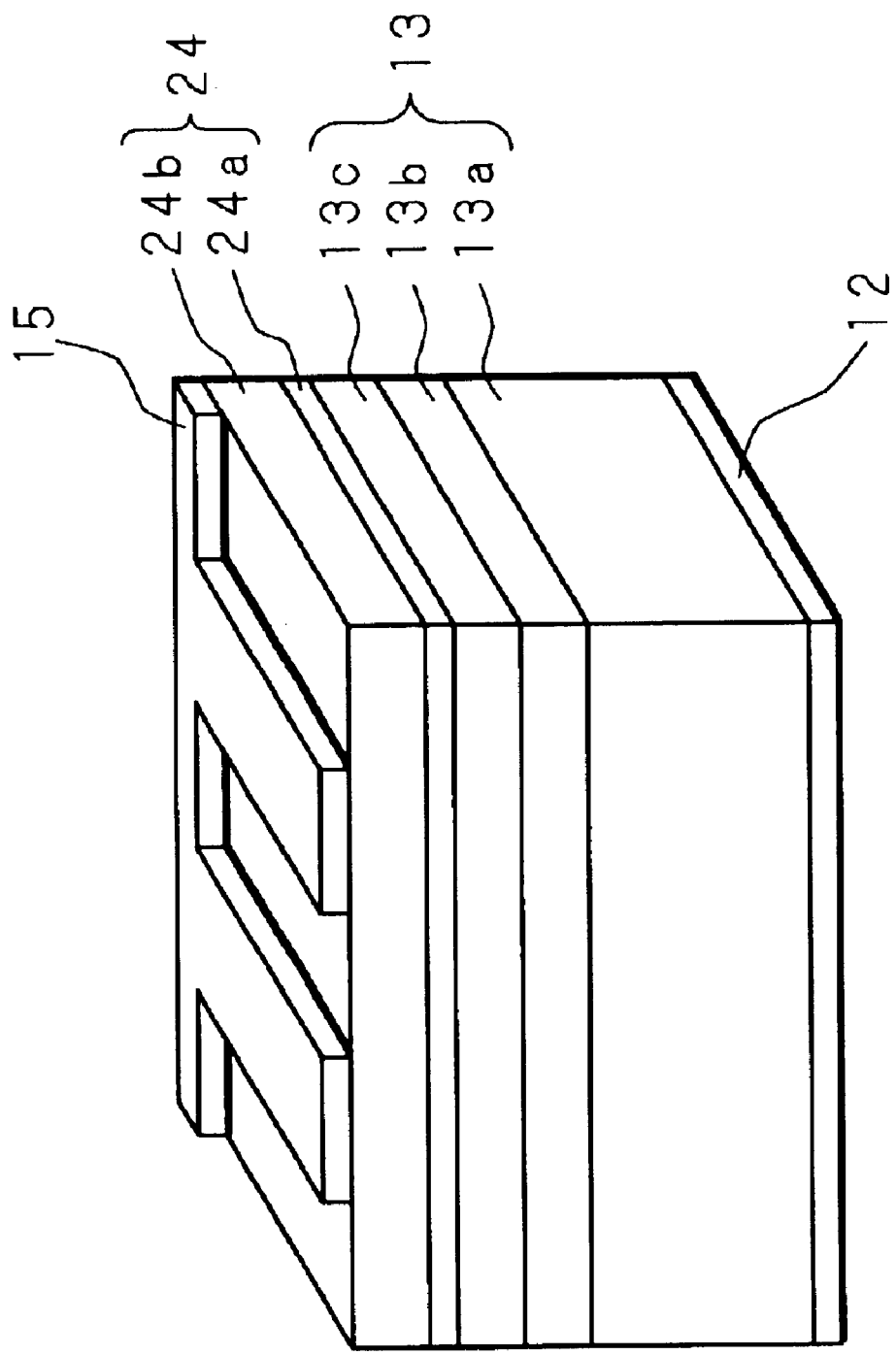
FIG. 7 is a perspective view showing another example of photovoltaic element of the present invention.
Figure 8:
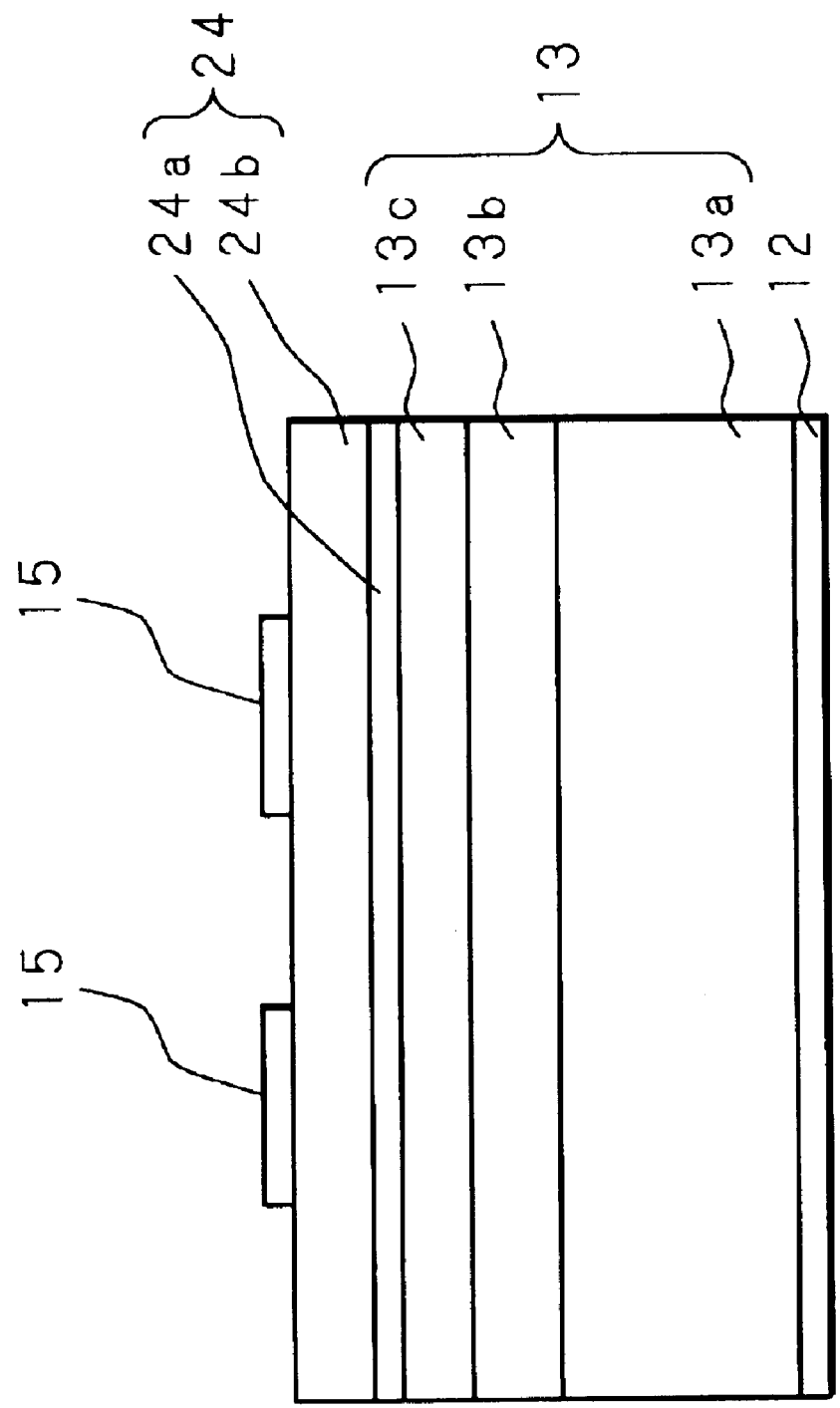
FIG. 8 is a schematic cross sectional view showing another example of photovoltaic element of the present invention.

FIG. 7 and FIG. 8 are the perspective view and schematic cross sectional view showing such an example of photovoltaic element of the present invention. In FIG. 7 and FIG. 8, the same parts as in FIG. 1 and FIG. 2 are designated with the same numbers, and the explanation of these parts is omitted.

A transparent conductive film 24 of this example is composed of an alkali diffusion prevention film 24a on the semiconductor layer 13 side and an ITO film 24b on the collecting electrode 15 side. Like the above-mentioned interface layer 14a, the alkali diffusion prevention film 24a has the function of reducing the diffusion of alkaline ions, and specifically is made of a film of amorphous SiO, SiN and SiON, a transparent conductive film including at least one of SiO, SiN and SiON, or a transparent metal film such as Ag, Al and Au with a thickness ranging from several Å to 100 Å.

With such a structure, it is also possible to realize the alkali ion diffusion reducing function of the alkali diffusion prevention film 24a, and the function of the ITO film 24b to achieve both high light transmittance and low electrical resistance.

Note that, in the above-illustrated examples, although the layer adjacent to the ITO film 14 or the transparent conductive film 24 is the p-type amorphous silicon hydride layer 13c, it is also possible to implement a mode in which an i-type amorphous silicon hydride layer and an n-type amorphous silicon hydride layer are successively deposited on a p-type microcrystalline silicon wafer, and then the ITO film 14 as a transparent conductive film or the transparent conductive film 24 is formed on the front surface of the n-type amorphous silicon hydride layer.

Of course, the ITO film 14 or the transparent conductive film 24 explained in the above examples is also applicable to an amorphous solar cell in which light is incident from the opposite side of the silicon wafer 13a, a microcrystalline solar cell, and a hybrid structure composed of an amorphous solar cell and a microcrystalline solar cell.

As described in detail above, in the photovoltaic element of the present invention, since the transparent conductive film comprises the alkali diffusion prevention region, it is possible to reduce the diffusion of alkaline ions through the grain boundaries as a path, and achieve both high efficiency and environment resistance reliability required for the photovoltaic element.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A photovoltaic element comprising:

a semiconductor layer; and a transparent conductive film formed on said semiconductor layer, wherein said transparent conductive film has an alkali diffusion prevention region, and the alkali diffusion prevention region has a lower crystallinity than other region of said transparent conductive film.

2. The photovoltaic element of claim 1, wherein said transparent conductive film has the alkali diffusion prevention region on a side adjacent to said semiconductor layer.

3. The photovoltaic element of claim 1, wherein said semiconductor layer includes a material selected from the group consisting of a-Si:H, a-SiC:H, a-SiGe:H, $\mu$c-Si:H, $\mu$c-SiC:H, and $\mu$c-SiGe:H.

4. The photovoltaic element of claim 1, wherein the alkali diffusion prevention region includes an amorphous component.

5. A photovoltaic element comprising, a semiconductor layer; and a transparent conductive film formed on said semiconductor layer, wherein said transparent conductive film has an alkali diffusion prevention region and the alkali diffusion prevention region includes silicon oxide, silicon nitride or a mixture thereof.

6. The photovoltaic element of claim 5, wherein said transparent conductive film has the alkali diffusion prevention region on a side adjacent to said semiconductor layer.

7. The photovoltaic element of claim 5, wherein any of said silicon oxide, silicon nitride or a mixture thereof is amorphous.

8. The photovoltaic element comprising, a semiconductor layer; and a transparent conductive film formed on said semiconductor layer, wherein said transparent conductive film has an alkali diffusion prevention region, and wherein the alkali diffusion prevention region and other region of said transparent conductive film are made of same material, and the alkali diffusion prevention region has a lower crystallinity compared to the other region.

9. The photovoltaic element of claim 8, wherein a crystallization ratio in the alkali diffusion prevention region is 0% to 90%, and preferably 0% to 10%.

10. The photovoltaic element of claim 8,
wherein the alkali diffusion prevention region has a thickness of not more than 20Å.

11. The photovoltaic element of claim 8,
wherein said semiconductor layer includes a material selected from the group consisting of a-Si:H, a-SiC:H, a-SiGe:H, $\mu$c-Si:H, $\mu$c-SiC:H, and $\mu$c-SiGe:H.

12. The photovoltaic element of claim 5,
wherein said semiconductor layer includes a material selected from the group consisting of a-Si:H, a-SiC:H, a-SiGe:H, $\mu$c-Si:H, $\mu$c-SiC:H, and $\mu$c-SiGe:H.

13. A photovoltaic element comprising:
a semiconductor layer; and
a transparent conductive film formed on said semiconductor layer,
wherein said transparent conductive film has an alkali diffusion prevention region and the alkali diffusion prevention region includes a transparent metal film.

14. The photovoltaic element of claim 13,
wherein the metal film has a thickness ranging from several Å to 100Å.

15. The photovoltaic element of claim 13,
wherein said transparent conductive film has the alkali diffusion prevention region on a side adjacent to said semiconductor layer.

16. The photovoltaic element of claim 13,
wherein said semiconductor layer includes a material selected from the group consisting of a-Si:H, a-SiC:H, a-SiGe:H, $\mu$c-Si:H, $\mu$c-SiC:H, and $\mu$c-SiGe:H.

* * * * *

UNITED STATES PATENT AND TRADEMARK OFFICE
CERTIFICATE OF CORRECTION

PATENT NO. : 6,849,917 B2
DATED : February 1, 2005
INVENTOR(S) : Eiji Maruyama

It is certified that error appears in the above-identified patent and that said Letters Patent is hereby corrected as shown below:

<u>Title page,</u>
Item [56], References Cited, insert
--      FOREIGN PATENT DOCUMENTS
JP    08-298332    12/96
JP    62-213281    9/87
JP    2002-25350    1/02
JP    2000-252500    9/00
JP    63-310505    12/88
JP    7-131044    5/95
JP    60-89573    5/85
JP    7-106614    4/95
JP    2000-150934    5/00 --

Signed and Sealed this

Ninth Day of August, 2005

JON W. DUDAS
*Director of the United States Patent and Trademark Office*